United States Patent
Albasini et al.

(10) Patent No.: US 7,961,833 B2
(45) Date of Patent: Jun. 14, 2011

(54) FRACTIONAL-TYPE PHASE-LOCKED LOOP CIRCUIT WITH COMPENSATION OF PHASE ERRORS

(75) Inventors: Guido Gabriele Albasini, Voghera (IT); Enrico Temporiti Milani, Pavia (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 1687 days.

(21) Appl. No.: 10/801,503

(22) Filed: Mar. 15, 2004

(65) Prior Publication Data
US 2004/0223576 A1    Nov. 11, 2004

(30) Foreign Application Priority Data

Mar. 14, 2003    (EP) .................................... 03425157

(51) Int. Cl.
*H03D 3/24* (2006.01)
(52) U.S. Cl. ...................................................... 375/376
(58) Field of Classification Search .......... 375/371–376; 331/1 R, 1 A
See application file for complete search history.

(56) References Cited

U.S. PATENT DOCUMENTS

| | | | |
|---|---|---|---|
| 4,179,670 | A | 12/1979 | Kingsbury |
| 4,965,531 | A | 10/1990 | Riley |
| 5,495,206 | A * | 2/1996 | Hietala .......................... 331/1 A |
| 5,818,303 | A * | 10/1998 | Oishi et al. ..................... 331/1 A |
| 5,834,987 | A * | 11/1998 | Dent ............................. 332/127 |
| 6,219,397 | B1 * | 4/2001 | Park ............................. 375/376 |
| 6,317,476 | B1 * | 11/2001 | Oishi et al. ..................... 375/371 |
| 6,344,812 | B1 | 2/2002 | Takeda et al. |
| 6,829,318 | B2 * | 12/2004 | Kawahara ...................... 375/376 |
| 7,079,616 | B2 * | 7/2006 | Castiglione et al. .......... 375/376 |
| 2001/0038314 | A1 | 11/2001 | Ichimaru |

(Continued)

FOREIGN PATENT DOCUMENTS

EP    0 452 031 A    10/1991

OTHER PUBLICATIONS

Carley L R.; "A Noise-Shaping Coder Topology for 15+ Bit Converters" IEEE Journal of Solid-State circuits, IEEE Inc. New York, US vol. 24, No. 2, pp. 267-273;Apr. 1, 1989. European Search Report dated Aug. 4, 2003 relating to the above prior art.

*Primary Examiner* — Khanh C Tran
(74) *Attorney, Agent, or Firm* — Lisa K. Jorgenson; Kevin D. Jablonski; Graybeal Jackson LLP (57) ABSTRACT

A fractional-type phase-locked loop circuit is proposed for synthesizing an output signal multiplying a frequency of a reference signal by a fractional conversion factor, the circuit including means for generating a modulation value, means for generating a feedback signal dividing the frequency of the output signal by a dividing ratio, the dividing ratio being modulated according to the modulation value for providing the conversion factor on the average, means for generating a control signal indicative of a phase difference between the reference signal and the feedback signal, means for controlling the frequency of the output signal according to the control signal, and means for compensating a phase error caused by the modulation of the dividing ratio; in the circuit of an embodiment of the invention, the means for compensating includes means for calculating an incremental value, indicative of an incremental phase error, according to the conversion factor and the modulation value, means for calculating a correction value accumulating the incremental value, and means for conditioning the control signal according to the correction value.

18 Claims, 4 Drawing Sheets

U.S. PATENT DOCUMENTS

2002/0041244 A1* 4/2002 Gandolfi et al. ............... 341/143
2002/0180539 A1* 12/2002 Keaveney et al. ............. 331/100
2003/0067816 A1* 4/2003 Anand et al. .................. 365/200
2003/0151535 A1* 8/2003 Melanson et al. ............ 341/143
2004/0145420 A1* 7/2004 Knierim et al. ................ 331/1 A
2005/0185491 A1* 8/2005 Kim et al. ..................... 365/222

* cited by examiner

FRACTIONAL-TYPE PHASE-LOCKED LOOP CIRCUIT WITH COMPENSATION OF PHASE ERRORS

PRIORITY CLAIM

This application claims priority from European patent application No. 03425157.9, filed Mar. 14, 2003, which is incorporated herein by reference.

TECHNICAL FIELD

An embodiment of the present invention relates to a fractional-type Phase-Locked Loop (PLL) circuit.

BACKGROUND

A PLL is a common component of several frequency synthesis systems. The PLL consists of a negative feedback circuit that allows multiplication of the frequency of a reference signal by a selected conversion factor; this results in the generation of a tuneable and stable output signal with the desired frequency.

For this purpose, a frequency divider scales the frequency of the output signal by the conversion factor. The resulting signal is fed back to a phase comparator, which detects a phase difference between the feedback signal and the reference signal; the phase comparator outputs a control current indicative of the phase difference. A loop filter integrates the control current into a corresponding voltage, which controls the frequency of the output signal accordingly. In a lock condition, the frequency of the feedback signal matches the frequency of the reference signal; therefore, the frequency of the output signal will be equal to the reference frequency multiplied by the conversion factor.

A particular architecture (commonly referred to as fractional-N) has become increasingly popular in the last few years, especially in wireless communication applications working at high frequency. In a fractional PLL, the dividing ratio of the frequency divider changes dynamically in the lock condition, so as to provide an average conversion factor equal to a fractional number. This structure allows finer resolution of the output frequency; moreover, the fractional PLL exhibits improved performance in terms of both settling time and phase noise.

Typically, the fractional PLL includes an accumulator that sums an adjusting value (defining a fractional part of the conversion factor) to itself continually. While the content of the accumulator is lower then its capacity (equal to the maximum allowed adjusting value), the frequency of the output signal is divided by an integer part of the conversion factor; whenever the accumulator overflows, the dividing ratio is incremented by one unit.

A problem of the fractional PLLs is that the feedback signal and the reference signal are not instantaneously at the same frequency in the lock condition. The periodicity of this phase error involves spurious signals (or spurs) at low-frequency offsets from a carrier. However, the content of the accumulator represents the current phase error between the feedback signal and the reference signal. Therefore, it is possible to reduce the level of the above-mentioned spurs with a technique also known as phase interpolation. For this purpose, the content of the accumulator is properly scaled and converted into a corresponding current; this current is then used to condition the control current that is injected into the loop filter, in order to have a control voltage always zero in the lock condition.

Operation of the accumulator can also be seen as a modulation of the adjusting value. In fact, the accumulator converts the fractional part of the conversion factor into a sequence of bits; the bits take the value 1 when the accumulator overflows or the value 0 otherwise. Therefore, it is possible to replace the accumulator (working as a first-order modulator) with an equivalent component.

For example, alternative architectures of the fractional PLL are based on a second or higher order sigma-delta modulator or on a multi-bit modulator. In both cases, the pattern of the dividing ratio is better shaped; particularly, the power of the spurs is pushed to higher frequency where the loop filter is more effective.

However, in the proposed architectures the value of the phase error (between the feedback signal and the reference signal) is not available in any accumulator. Therefore, it is not possible to condition the control current directly, in order to compensate the effects of the phase error caused by the modulation of the dividing ratio.

SUMMARY

Briefly, an embodiment of the present invention provides a fractional-type phase-locked loop circuit for synthesising an output signal multiplying a frequency of a reference signal by a fractional conversion factor, the circuit including means for generating a modulation value, means for generating a feedback signal dividing the frequency of the output signal by a dividing ratio, the dividing ratio being modulated according to the modulation value for providing the conversion factor on the average, means for generating a control signal indicative of a phase difference between the reference signal and the feedback signal, means for controlling the frequency of the output signal according to the control signal, and means for compensating a phase error caused by the modulation of the dividing ratio, wherein the means for compensating includes means for calculating an incremental value, indicative of an incremental phase error, according to the conversion factor and the modulation value, means for calculating a correction value accumulating the incremental value, and means for conditioning the control signal according to the correction value.

Moreover, a corresponding synthesising method is also encompassed in an embodiment of the present invention.

BRIEF DESCRIPTON OF THE DRAWINGS

Further features and the advantages of the solution according to the present invention will be made clear by the following description of a preferred embodiment thereof, given purely by way of a non-restrictive indication, with reference to the attached figures, in which.

DETAILED DESCRIPTION

Figure 1A:
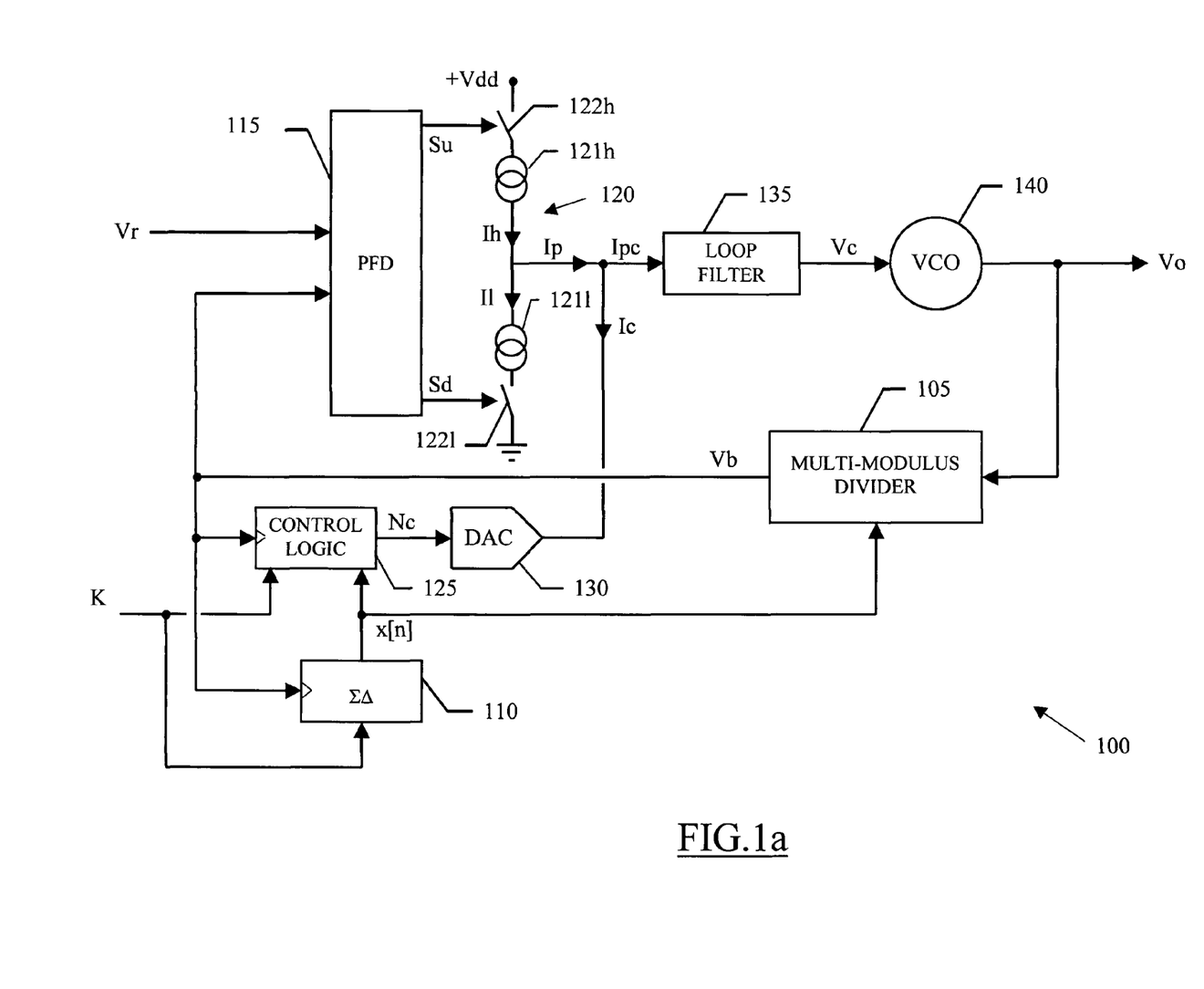
FIG. 1a shows the functional blocks of a PLL according to an embodiment of the invention.

With reference in particular to FIG. 1a, a digital PLL 100 of the fractional type is shown. The PLL 100 is used to synthesise an output signal Vo with a desired frequency Fo. The output signal Vo is obtained by multiplying a frequency Fr of a reference signal Vr by a selected conversion factor (consisting of a fractional number defining a channel of operation of the PLL 100); the reference signal Vr is typically generated by a quartz oscillator (not shown in the figure), which provides a stable and accurate time base.

For this purpose, the PLL 100 implements a feedback loop through a multi-modulus divider 105, which derives a signal Vb (having a frequency Fb) from the output signal Vo. The multi-modulus divider 105 is controlled by an integer taking a value x[n] at the n-th cycle of the signal Vb; the value x[n] is used to modulate a dividing ratio of the block 105 about a nominal value N, which represents an integer component of the conversion factor; The modulation value x[n] is provided by a modulator 110, usually of a sigma-delta.($\Sigma\Delta$) type, which is clocked by the signal Vb. The sigma-delta modulator 110 receives as an input a further external signal K; the parameter K is an adjusting value consisting of an integer varying from 0 to a modulus M (with the value K/M that represents a fractional component of the conversion factor). The block 105 divides the frequency Fo of the output signal Vo by a dividing ratio N+x[n]. The signal Vb resulting from the division is fed back to a Phase Frequency Detector (PFD) 115.

The PFD 115 detects a phase difference between the feedback signal Vb and the reference signal Vr either lower than +/−2π radians or higher than +/−2π radians (commonly referred to as frequency difference). The PFD 115 outputs a phase-indicator up signal Su and a phase-indicator down signal Sd, which are used to control a charge pump 120. Typically, the charge pump 120 includes a high-side leg (referred to a power supply voltage +Vdd) and a low-side leg (referred to ground). The high-side leg consists of a current generator 121*h* (providing a current Ih), which is connected in series to an electronic switch 122*h*; likewise, the low-side leg consists of a current generator 121*l* (providing a current Il), which is connected in series to an electronic switch 122*l*. The switch 122*h* and the switch 122*l* are controlled by the up-signal Su and by the down-signal Sd, respectively. The high-side leg and the low-side leg are connected to each other, and define an output node of the charge pump 120 that supplies a current Ip.

A control logic 125, which is clocked by the feedback signal Vb, receives the modulation value x[n] (from the sigma-delta modulator 110) and the adjusting value K. The control logic 125 outputs an (integer) correction value Nc. A servo Digital-to-Analog Converter (DAC) 130 (clocked by the reference signal Vr) converts the correction value Nc into a corresponding current Ic. The current Ic is used to condition the charge-pump current Ip; for this purpose, the conditioning current Ic is provided to the output node of the charge pump 120.

A resulting control current Ipc=Ip−Ic is injected into a loop filter 135. The loop filter 135 removes the high frequency components of the control current Ipc; the control current Ipc is then integrated into a corresponding voltage Vc every period of the reference signal Vr. The control voltage Vc drives a Voltage-Controlled Oscillator (VCO) 140, which provides the output signal Vo.

During operation of the PLL 100, the VCO 140 starts oscillating at a free-run frequency as a consequence of background noise in the circuit. The block 105 divides the frequency Fo of the output signal Vo by N+x[n]. The dividing ratio oscillates about the nominal value N according to the adjusting value K; in a fractional cycle consisting of M reference cycles (or a multiple thereof), the dividing ratio has an average value N*=N+K/M.

In an unlock condition (such as during an initial power up or immediately after a channel switching), the frequency Fb of the feedback signal Vb is different from the frequency Fr of the reference signal Vr. The up-signal Su is asserted upon detection of a raising edge of the reference signal Vr, in response thereto, the switch 122*h* is closed and the current Ih is injected into the output node of the charge-pump 120. Likewise, the down-signal Sd is asserted upon detection of a raising edge of the feedback signal Vb; the switch 122*l* is then closed and the current Il is sunk from the output node of the charge-pump 120. The PFD 115 is reset after a short delay from the assertion of both the signals Su and Sd (in order to compensate a dead-zone of the charge pump 120); as a consequence, the switches 122*h*, 122*l* are opened so as to cut off the corresponding currents Ih,Il. The charge-pump current Ip then consists of a series of pulses indicative of the phase difference between the signals Vb and Vr. Particularly, each pulse of the charge-pump current Ip has a width proportional to the module of the phase difference; the pulse is positive when the raising edge of the feedback signal Vb follows the raising edge of the reference signal Vr, or it is negative otherwise.

The corresponding control voltage Vc (disregarding the conditioning current Ic for the time being) updates the frequency Fo of the output signal Vo accordingly (every reference cycle). Particularly, when the feedback frequency Fb is lower than the reference frequency Fr, the control voltage Vc instructs the VCO 140 to increase the output frequency Fo; conversely, when the feedback frequency Fb is higher than the reference frequency Fr, the control voltage Vc instructs the VCO 140 to reduce the output frequency Fo.

Similar considerations apply to any phase difference between the feedback signal Vb and the reference signal Vr.

The PLL 100 locks when the average frequency of the feedback signal Vb matches the frequency Fr of the reference signal Vr. In this condition, the frequency Fo of the output signal Vo is thus equal to Fr*N* (on the average). Therefore, the PLL 100 delivers an output signal Vo with a frequency Fo having any desired value that is multiple of the frequency Fr of the reference signal Vr, according to the conversion factor N*=N+K/M.

However, in the lock condition the feedback signal Vb and the reference signal Vr are not instantaneously at the same frequency. Particularly, whenever the dividing ratio of the multi-modulus divider 105 is lower than the conversion factor N*, the frequency Fb of the feedback signal Vb will be higher than the frequency Fr of the reference signal Vr; therefore, their phase difference increases. Conversely, when the dividing ratio of the multi-modulus divider 105 is higher than the conversion factor N*, the frequency Fb of the feedback signal Vb will be lower than the frequency Fr of the reference signal Vr, therefore, their phase difference decreases.

The pattern of a phase error caused by the modulation of the dividing ratio (in the multi-modulus divider 105) has a periodicity equal to the fractional cycle. Therefore, this phase error involves spurious signals (or spurs) at low-frequency offsets from a carrier Vo; the spurs cannot be removed by the loop filter 135, since that would require a too-narrow loop bandwidth (with an intolerable increase in a settling time and in a phase noise of the PLL 100).

The use of the sigma-delta modulator 110 for generating the modulation value x[n] shapes the level of the above-mentioned spurs. In detail, the sigma-delta modulator 110 typically includes a truncator that performs a coarse quantization discarding the least significant bits of its input value.

One or more digital filters integrate a quantization error, which is then added to the adjusting value K through a feedback loop. The resulting value is then provided to the truncator. Preferably, the sigma-delta modulator 110 is of a multi-bit type, wherein the modulation value x[n] is represented by two or more bits; for example, in a sigma-delta modulator 110 with a resolution of 2 bits, the modulation value x[n] can take any integer value in the range from −1 to +2.

The operations described above result in a stream of modulation values x[n] that represents the fractional channel K/M (over the fractional cycle). The sigma-delta modulator 110 spreads the power of the quantization error over a large band, so that its density in the band of operation of the PLL 100 is reduced. Moreover, each filter shapes the quantization error so that its spectrum is not uniform, thereby pushing the quantization error power out of the band of interest; the degree of shaping is defined by the number of filters (referred to as the order of the sigma-delta modulator 110). The shaping of the quantization error power is further improved when the sigma-delta modulator 110 is of the multi-bit type. In this way, the out-of-band components of the resulting phase error can be removed by the loop-filter 135.

However, in the above-described architecture the current value of the phase error (between the feedback signal Vb and the reference signal Vr) is not available in the sigma-delta modulator 110; apparently, it is then not possible to implement a phase interpolation technique known in the art, in order to compensate the effects of the phase error (as in PLLs including a standard accumulator).

An embodiment of the present invention is based on the intuition that a similar compensation technique can also be applied to different architectures of the PLL, wherein the value of the phase error is not available in any accumulator. The inventors have discovered that an incremental value of the phase error can be predicted (at any reference cycle), according to the current modulation value x[n] and the parameters defining the selected conversion factor (for example, the nominal value N, the adjusting value K and the modulus M).

In detail, it is possible to demonstrate that when the modulation value x[n] is zero (and then the dividing ratio is N), the multi-modulus divider 105 introduces an incremental phase error equal to $$2\pi \frac{K}{MN + K}$$

radians; the modulation of the dividing ratio by the sigma-delta modulator 110 (through the modulation value x[n]) subtracts $$2\pi \frac{Mx[n]}{MN + K}$$

radians from the incremental phase error. Therefore, a phase error ΔΦ[n] at the n-th reference cycle can be calculated from the phase error ΔΦ[n−1] at the preceding reference cycle according to the following formula:

$$\Delta\phi[n] = \Delta\phi[n-1] + 2\pi\left(\frac{K - Mx[n]}{MN + K}\right)$$

Considering that the adjusting value K is negligible with respect to the product MN (for example, K varies from 0 to M=16 and N=1,000), the formula can be approximated by:

$$\Delta\phi[n] = \Delta\phi[n-1] + 2\pi\left(\frac{K - Mx[n]}{MN}\right)$$

Every reference cycle, the control logic 125 calculates the correction value Nc (either positive or negative), which represents the phase error defined by the above-mentioned formula (properly scaled). The correction value Nc is converted into the corresponding current Ic, which conditions the charge-pump current Ip accordingly.

Figure 1B:
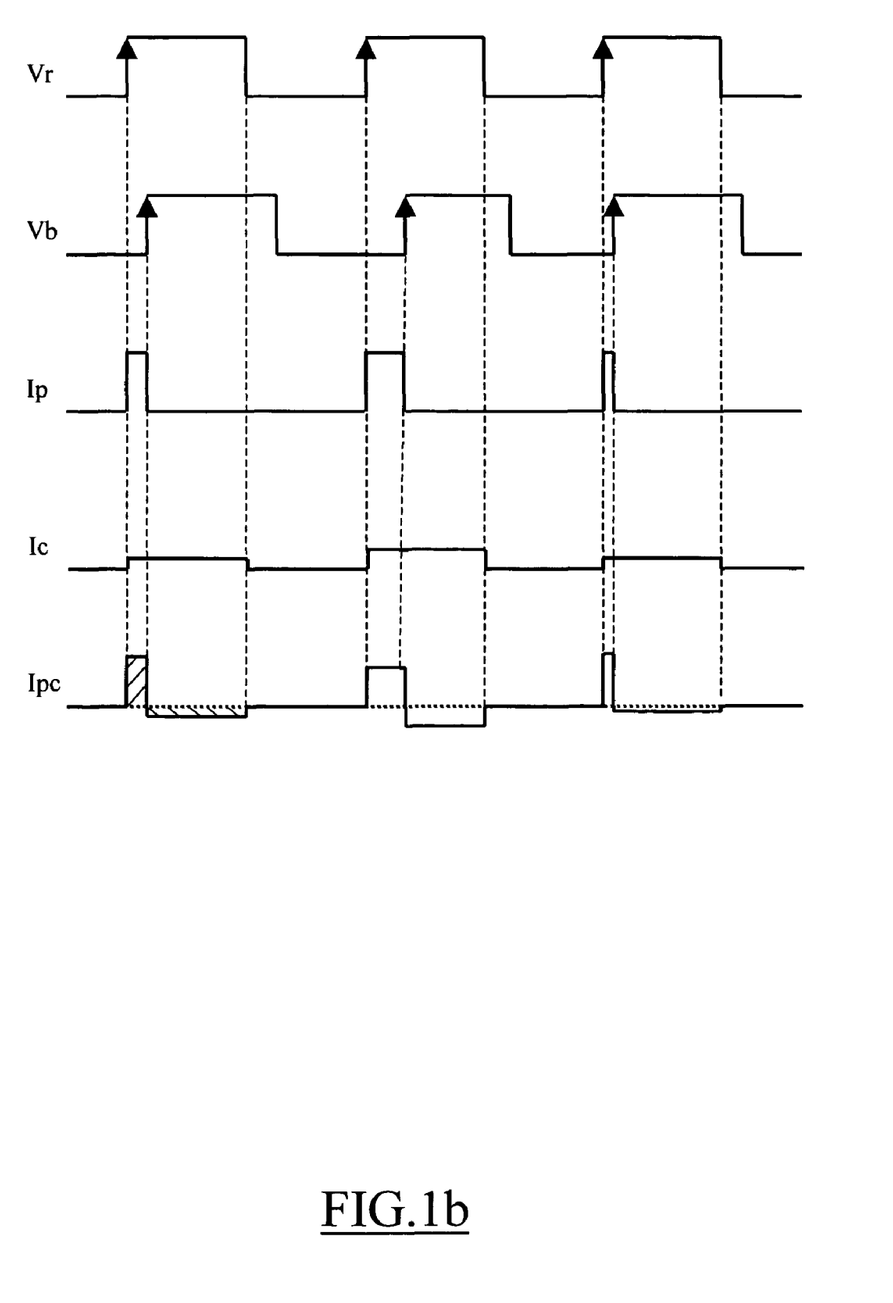
FIG. 1b is a simplified time diagram describing operation of the PLL of FIG. 1a according to an embodiment of the invention.

Particularly, as shown in the simplified time diagram of FIG. 1b, the phase error between the feedback signal Vb and the reference signal Vr results in a series of pulses of the charge-pump current Ip; each pulse has a width proportional to the phase error (with a constant amplitude). The conditioning current Ic consists of a series of pulses, which are generated in response to the raising edges of the reference signal Vr. Each pulse has a constant width, usually correlated to the period of the reference signal Vr (for example, equal to half a period of the reference signal Vr); conversely, the amplitude of the pulse corresponds to the correction value Nc (with the pulse that is positive or negative according to the sign of the correction value Nc). In an ideal situation, in the lock condition shown in the figure, the area of each pulse of the conditioning current Ic is the same as the area of the corresponding pulse of the charge-pump current Ip; as a consequence, the control current Ipc injected into the loop filter every reference cycle is zero (i.e., the positive area is the same as the negative area).

However, the concepts of an embodiment of the present invention are also applicable when the PLL has another structure or includes equivalent elements; for example, the PFD can be replaced with a mixer or XOR-gates, or the positions of the current generators and of the switches in every leg of the charge pump can be reversed. Similar considerations apply if the PLL works with different operative parameters, if equivalent signals are envisaged, or if the pulses of the conditioning current have a different width or are generated in another way (for example, in response to the raising edges of the feedback signal). Alternatively, the sigma-delta modulator is of a higher order, it has a different resolution, or it is replaced with a generic multi-bit modulator (implementing a plurality of internal loops, so that the current value of the phase error is not available in any accumulator).

Figure 2:
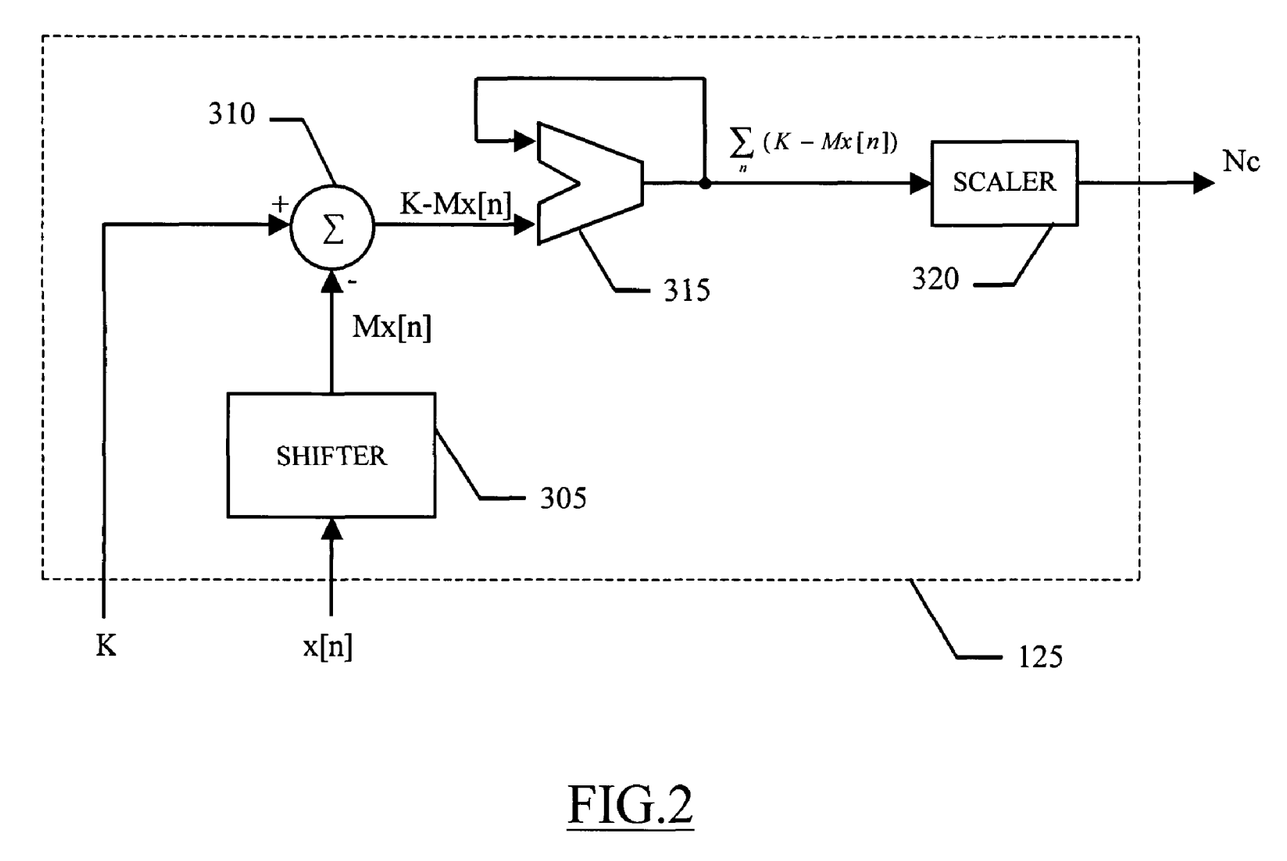
FIG. 2 is a schematic block diagram of a control logic of the PLL of FIG. 1a according to an embodiment of the invention.

A proposed structure of the control logic 125 that implements the above-described formula is shown in FIG. 2. Particularly, the control logic 125 includes a multiplier 305 operating on the modulation value x[n] and the modulus M; the multiplier 305 is typically implemented with a shifter, which moves the bits representing the modulation value x[n] a number of positions corresponding to the bits of the modulus M. For example, when the modulus M is $2^4$=16, the modulation value x[n] is shifted 4 positions. An adder 310 subtracts the value Mx[n] (output by the shifter 305) from the adjusting value K. A resulting incremental value K−Mx[n] is provided to a first input of an accumulator 315; a second input of the accumulator 315 is directly connected to its output. A block 320 scales the content of the accumulator $$315\left(\sum_n (K - Mx[n])\right)$$

according to the value MN. The scaler 320 directly provides the correction value Nc to the servo-DAC; the correction value Nc is represented by a signed binary code having a pre-defined number of bits (for example, 1 bit for the sign and 4 bits for the module).

However, the concepts of an embodiment of the present invention are also applicable when the control logic has another architecture or includes equivalent components. Similar considerations apply if the correction value is always positive or negative (according to the implementation of the modulator), or if the correction value has a different resolution (down to a single bit). Alternatively, the same function of the scaler is performed by the servo-DAC (properly setting its full-scale current).

A further problem that adversely affects operation of the PLL is the non-linearity of the servo-DAC. In fact, the inherent imprecision of the technological processes used to implement the servo-DAC involves an error in the currents assigned to each bit of the correction value Nc. The non-linearity of the servo-DAC causes a folding of the spurs; this results in an increment of their power near the carrier (where the loop-filter is less effective).

In order to overcome the above-mentioned drawbacks, an embodiment of the present invention further proposes different solutions for reducing the effects of the non-linearity in the servo-DAC.

Figure 3:
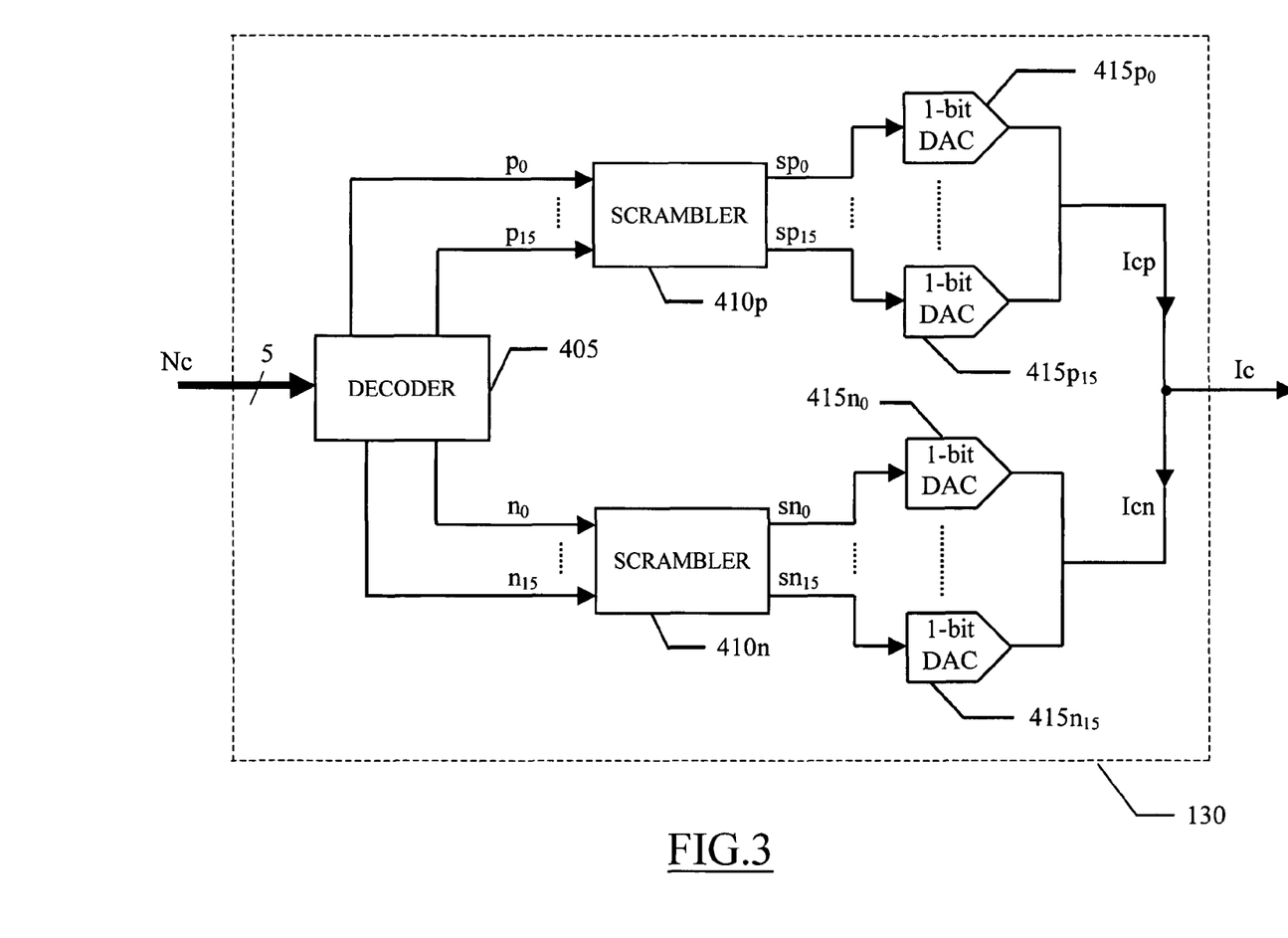
FIG. 3 depicts a preferred implementation of a servo-DAC used in the PLL of FIG. 1a according to an embodiment of the invention.

With reference in particular to FIG. 3, the servo-DAC 130 includes a decoder 405 receiving the correction value Nc. The decoder 405 converts the binary representation of the correction value Nc into a thermometric code. The thermometric representation of the correction value Nc consists of a number of bits equal to its maximum absolute value (16 in the example at issue); the thermometric bits are of even weight, and each one corresponds to a possible level of the correction value Nc. The correction value Nc is represented setting to 1 all the thermometric bits up to the one corresponding to its module. For example, the correction value Nc=±9 is represented by the thermometric bits 0000000111111111.

If the correction value Nc is positive, the thermometric bits representing its module (denoted with $P_0$-$p_{15}$) are provided to a scrambler 410$p$. The scrambler 410$p$ has an input terminal for each thermometric bit $P_0$-$p_{15}$, and an equal number of output terminals each one providing a corresponding scrambled bit $sp_0$-$sp_{15}$. Each input terminal of the scrambler 410$p$ is selectively connected to an output terminal according to either a random algorithm or a "barrel-shift" algorithm. In the random algorithm, each thermometric bit $p_0$-$p_{15}$ is transferred to an output terminal selected in a pseudo-random way. Conversely, in the barrel-shift algorithm the output terminals receive the thermometric bits $p_0$-$p_{15}$ at 1 along a wrap-around circular list; for example, the correction value Nc=+7 causes the setting of the scrambled bits $sp_0$-$sp_6$, the next correction value Nc=+11 causes the setting of the scrambled bits $sp_7$-$sp_{15}$, $sp_0$-$sp_1$, the further next correction value Nc=+4 causes the setting of the scrambled bits $sp_2$-$sp_5$, and so on. Each scrambled bit $sp_0$-$sp_{15}$ (from the scrambler 410$p$) drives a corresponding single-bit DAC 415$p_0$-415$p_{15}$. The output terminals of all the single-bit DACs 415$p_0$-415$p_{15}$ are connected to a common node, so as to inject a current lcp into an output terminal of the servo-DAC 130.

Conversely, if the correction value Nc is negative the corresponding thermometric bits representing its module (denoted with $n_0$-$n_{15}$) are provided to a further scrambler 410$n$. The scrambler 410$n$ (implementing either the random algorithm or the "barrel-shift" algorithm) outputs corresponding scrambled bits $sn_0$-$sn_{15}$. Each scrambled bit $sn_0$-$sn_{15}$ drives a respective single-bit DAC 415$n_0$-415$n_{15}$. The output terminals of all the single-bit DACs 415$n_0$-415$n_{15}$ are connected to a common node, so as to sink a current lcn from the output terminal of the servo-DAC 130.

The conditioning current lc alternatively corresponds to the current lcp (when the correction value Nc is positive) or to the current lcn (when the correction value Nc is negative). In this way, the conditioning current lc is generated summing the currents delivered by the single-bit DACs 415$p_0$-415$p_{15}$ or 415$n_0$-415$n_{15}$, which exhibit a high linearity. Moreover, when the scramblers 410$p$, 410$n$ implement the random algorithm the single-bit DACs 415$p_0$-415$p_{15}$, 415$n_0$-415$n_{15}$ are statistically actuated with an even frequency; conversely, when the scramblers 410$p$, 410$n$ implement the barrel-shift algorithm the single-bit DACs 415$p_0$-415$p_{15}$, 415$n_0$-415$n_{15}$ are actuated in succession. In both cases, any periodic effect in the conditioning current lc (caused by the mismatching of the single-bit DACs 415$p_0$-415$p_{15}$, 415$n_0$-415$n_{15}$) is substantially limited. As a result, the power of the spurs near the carrier is strongly reduced.

However, the concepts of an embodiment of the present invention are also applicable when the servo-DAC has another architecture or includes equivalent components; similar considerations apply if different thermometric representations and/or scrambling algorithms are employed. Alternatively, the servo-DAC only includes a single path (either for the positive correction values or for the negative correction values), the two paths share some blocks (for example, the scrambler). Moreover, alternative techniques can be used to improve the linearity of the servo-DAC.

More generally, an embodiment of the present invention proposes a fractional-type phase-locked loop circuit, which is used for synthesising an output signal multiplying a frequency of a reference signal by a fractional conversion factor. The circuit includes means for generating a modulation value. A feedback signal is generated dividing the frequency of the output signal by a dividing ratio; the dividing ratio is modulated according to the modulation value, in order to provide the conversion factor on the average. Means are further provided for generating a control signal, which is indicative of a phase difference between the reference signal and the feedback signal. The frequency of the output signal is controlled according to the control signal. The circuit also includes means for compensating a phase error caused by the modulation of the dividing ratio. In the solution of an embodiment of the invention, the means for compensating includes means for calculating an incremental value (indicative of an incremental phase error) according to the conversion factor and the modulation value. A correction value is calculated accumulating the incremental value. The control signal is then conditioned according to the correction value.

The solution of an embodiment of the invention allows compensating the effects of the phase error (between the feedback signal and the reference signal) even in architectures wherein the value of the phase error is not available in any accumulator.

As a consequence, the spurs caused by the phase error are strongly reduced.

This result is achieved without giving up the improved shaping in the pattern of the dividing ratio, which is provided by sophisticated modulation techniques.

The preferred embodiment of the invention described above offers further advantages.

Particularly, the devised solution is specifically designed for a PLL implemented with a sigma-delta modulator of the second or higher order.

Preferably, the modulator is of a multi-bit type.

In both cases, the overall performance of the PLL is strongly improved.

However, the solution of an embodiment of the present invention is also suitable to be implemented in a PLL including a sigma-delta modulator of the first order, a modulator that is not of the sigma-delta type, a single-bit modulator, or more generally any other equivalent means for modulating the dividing ratio.

A suggested choice for calculating the correction value is to accumulate an incremental value calculated according to the proposed formula; the accumulated value is then scaled according to the modulus M and the conversion factor (for example, by MN).

This implementation is very simple, but at the same time effective.

Alternatively, the accumulated value is scaled further according to a mean value of the adjusting value K (i.e., dividing the accumulated value by MN+M/2), or the correct formula is applied also taking into account the current adjusting value K (and then dividing the accumulated value by MN+K).

A way to further improve the solution is to convert the representation of the correction value into a thermometric code.

The proposed feature allows generating the conditioning current with multiple DACs having a reduced resolution, and then an improved linearity.

As a further enhancement, each DAC is of the single-bit type.

In this way, the overall linearity of the servo-DAC is improved as much as possible.

However, the solution according to an embodiment of the present invention is also suitable to be implemented using a thermometric code representing the correction value with non-binary digits (with corresponding DACs at more than two levels), or even without any conversion of the correction value.

In a preferred embodiment of the invention, two sets of single-bit DACs are provided (a first one for positive correction values and a second one for negative correction values).

The proposed structure makes it possible to exploit the above-mentioned advantages also in a PLL including a multi-bit modulator (wherein the phase error can be either positive or negative).

Advantageously, the thermometric bits representing the correction value are scrambled.

A devised solution strongly reduces any periodic effect in the conditioning current.

A suggested choice for implementing the scrambling consists of using a random algorithm or a barrel shift algorithm.

In both cases, the power of the spurs near the carrier is strongly reduced.

However, the control logic of an embodiment of the present invention lends itself to be implemented with only one set of single-bit DACs (when the correction value is always positive or negative), with a different scrambling algorithm, or even without any scrambling of the thermometric bits of the correction value.

Vice-versa, it should be noted that the proposed structure of the servo-DAC (with the conversion of the correction value into the thermometric representation, and possibly with the scrambling of the thermometric bits) is suitable to be used independently of the proposed compensation schema. For example, these additional features can be implemented (either alone or in combination) even in a PLL with a standard accumulator.

The circuit 100 may be part of an electronic system, such as, for example, a computer system or wireless communication device.

Naturally, in order to satisfy local and specific requirements, a person skilled in the art may apply to the solution described above many modifications and alterations all of which, however, are included within the scope of protection of an embodiment of the invention.

What is claimed is:

1. A fractional-type phase-locked loop circuit for synthesizing an output signal by multiplying a frequency of a reference signal by a fractional conversion factor, the circuit including: means for generating a modulation value, means for generating a feedback signal by dividing the frequency of the output signal by a dividing ratio, the dividing ratio being modulated according to the modulation value for providing the conversion factor on an average, means for generating a control signal indicative of a phase difference between the reference signal and the feedback signal, means for controlling the frequency of the output signal according to the control signal, and means for compensating a phase error caused by the modulation of the dividing ratio, wherein the means for compensating includes means for calculating an incremental value, indicative of an incremental phase error, according to the conversion factor and the modulation value, means for calculating a correction value accumulating the incremental value, and means for conditioning the control signal according to the correction value.

2. A fractional-type phase-locked loop circuit for synthesizing an output signal by multiplying a frequency of a reference signal by a fractional conversion factor, the circuit including: means for generating a modulation value, means for generating a feedback signal by dividing the frequency of the output signal by a dividing ratio, the dividing ratio being modulated according to the modulation value for providing the conversion factor on an average, means for generating a control signal indicative of a phase difference between the reference signal and the feedback signal, means for controlling the frequency of the output signal according to the control signal, and means for compensating a phase error caused by the modulation of the dividing ratio, wherein the means for compensating includes means for calculating an incremental value, indicative of an incremental phase error, according to the conversion factor and the modulation value, means for calculating a correction value accumulating the incremental value, and means for conditioning the control signal according to the correction value, and wherein the means for generating the modulation value includes a sigma-delta modulator having an order at least equal to two.

3. A fractional-type phase-locked loop circuit for synthesizing an output signal by multiplying a frequency of a reference signal by a fractional conversion factor, the circuit including: means for generating a modulation value, means for generating a feedback signal by dividing the frequency of the output signal by a dividing ratio, the dividing ratio being modulated according to the modulation value for providing the conversion factor on an average, means for generating a control signal indicative of a phase difference between the reference signal and the feedback signal, means for controlling the frequency of the output signal according to the control signal, and means for compensating a phase error caused by the modulation of the dividing ratio, wherein the means for compensating includes means for calculating an incremental value, indicative of an incremental phase error, according to the conversion factor and the modulation value, and means for calculating a correction value accumulating the incremental value, and means for conditioning the control signal according to the correction value, and wherein the means for generating the modulation value includes a multi-bit modulator.

4. The circuit according to claim 1, wherein the means for generating the modulation value is responsive to an adjusting value consisting of an integer varying from zero to a pre-defined modulus, the means for calculating the incremental value including means for calculating a first value multiplying the modulation value by the pre-defined modulus and means for calculating a second value subtracting the first value from the adjusting value, and wherein the means for calculating the correction value includes means for accumulating the second value and means for scaling the accumulated second value according to the pre-defined modulus and the conversion factor.

5. The circuit according to claim 1, wherein the means for conditioning includes means for converting a representation of the correction value into a thermometric code consisting of a plurality of thermometric digits of even weight, and a plurality of digital-to-analog converters each one for a corresponding thermometric digit.

6. The circuit according to claim 5, wherein each thermometric digit consists of a thermometric bit, each digital-to-analog converter being a single-bit converter.

7. The circuit according to claim 6, wherein the correction value consists of a signed value, the digital-to-analog converters consisting of a first plurality of the single-bit converters each one for a corresponding thermometric bit representing a module of the correction value when positive and a second plurality of single-bit converters each one for a corresponding thermometric bit representing the module of the correction value when negative.

8. The circuit according to claim 5, wherein the means for conditioning further includes means for scrambling the thermometric digits.

9. The circuit according to claim 8, wherein the means for scrambling includes means for re-arranging the thermometric digits according to a random algorithm or a barrel shift algorithm.

10. In a fractional-type phase-locked loop circuit, a method of synthesizing an output signal multiplying a frequency of a reference signal by a fractional conversion factor, the method including the steps of:

generating a modulation value with a modulator, generating a feedback signal dividing the frequency of the output signal by a dividing ratio, the dividing ratio being modulated according to the modulation value for providing the conversion factor on the average, generating a control signal indicative of a phase difference between the reference signal and the feedback signal, controlling the frequency of the output signal according to the control signal, and compensating a phase error caused by the modulation of the dividing ratio, wherein the step of compensating includes:

calculating an incremental value, indicative of an incremental phase error, according to the conversion factor and the modulation value, calculating a correction value accumulating the incremental value, and conditioning the control signal according to the correction value.

11. A phase-locked loop, comprising:

a phase-frequency detector operable to generate a phase-error signal based on a comparison of a reference signal and a feedback signal;

a control circuit coupled to the phase-frequency detector and operable to generate a conditioning signal based on a modulation value and the feedback signal; and a generator coupled to the control circuit and the phase-frequency detector and operable to receive a control signal to generate an output signal, the control signal based on a summation of the phase-error signal and conditioning signal, wherein the control circuit comprises:

a sigma-delta modulator operable to generate the modulation value a control logic block coupled to the sigma-delta modulator and operable to generate a correction value based on the modulation value and an adjusting value, the control logic block clocked by the feedback signal; and a digital-to-analog converter coupled to the control logic block operable to generate the conditioning signal based on the correction value.

12. The phase-locked loop of claim 11, further comprising a filter coupled to the generator and operable to filter the control signal before the control signal is received by the generator.

13. The phase-locked loop of claim 11, further comprising a multi-modulus frequency divider coupled to the phase-frequency detector and operable to modify the feedback signal based on the modulation value.

14. A phase-locked loop, comprising:

a phase-frequency detector operable to generate a phase-error signal based on a comparison of a reference signal and a feedback signal;

a control circuit coupled to the phase-frequency detector and operable to generate a conditioning signal based on a modulation value and the feedback signal; and a generator coupled to the control circuit and the phase-frequency detector and operable to receive a control signal to generate an output signal, the control signal based on a summation of the phase-error signal and conditioning signal;

wherein the control circuit comprises:

a sigma-delta modulator operable to generate the modulation value;

a control logic block coupled to the sigma-delta modulator and operable to generate a correction value based on the modulation value and an adjusting value, the control logic block clocked by the feedback signal;

a digital-to-analog converter coupled to the control logic block operable to generate the conditioning signal based on the correction value; and wherein the sigma-delta generator comprises a first modifier operable to convert a first data set corresponding to the adjusting value into a second data set.

15. The phase-locked loop of claim 14 wherein the sigma-delta generator further comprises a second modifier coupled to the first modifier, the second modifier operable to convert the second data set into the modulation value.

16. A method for controlling the output of a phase-locked loop, the method comprising:
- determining a phase difference between a reference signal and a feedback signal with a phase frequency detector;
- generating a phase-error signal from the determined phase difference;
- generating a conditioning signal based upon a modulation value and the feedback signal;
- modifying the phase-error signal with the conditioning signal; and
- generating an output signal with a generator from the modified phase-error signal;

wherein generating the conditioning signal comprises:
- generating a first data set based on an adjusting value
- generating a second data set based on a the first set of data and modulation value; and
- generating the conditioning signal based on the second data set.

17. The method of claim 16, further comprising generating the feedback signal based on the output signal and the modulation value.

18. The method of claim 16, further comprising filtering the modified phase-error signal.

* * * * *

UNITED STATES PATENT AND TRADEMARK OFFICE
CERTIFICATE OF CORRECTION

| | | |
|---|---|---|
| PATENT NO. | : 7,961,833 B2 | Page 1 of 1 |
| APPLICATION NO. | : 10/801503 | |
| DATED | : June 14, 2011 | |
| INVENTOR(S) | : Guido Gabriele Albasini et al. | |

It is certified that error appears in the above-identified patent and that said Letters Patent is hereby corrected as shown below:

- In claim 16, Column 14, Line 3 of the patent, "based on a the first set of data" should read --based on the first set of data--.

Signed and Sealed this
Fourth Day of October, 2011

David J. Kappos
*Director of the United States Patent and Trademark Office*